(12) United States Patent
Ranjan et al.

(10) Patent No.: US 8,389,301 B2
(45) Date of Patent: Mar. 5, 2013

(54) NON-UNIFORM SWITCHING BASED NON-VOLATILE MAGNETIC BASED MEMORY

(75) Inventors: Rajiv Yadav Ranjan, San Jose, CA (US); Petro Estakhri, Danville, CA (US); Mahmud Assar, Aptos, CA (US); Parviz Keshtbod, Los Altos Hills, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 13/305,668

(22) Filed: Nov. 28, 2011

(65) Prior Publication Data

US 2012/0068236 A1 Mar. 22, 2012

Related U.S. Application Data

(62) Division of application No. 11/674,124, filed on Feb. 12, 2007, now Pat. No. 8,084,835.

(51) Int. Cl.
*H01L 21/00* (2006.01)

(52) U.S. Cl. .............................. 438/3; 257/295; 257/421

(58) Field of Classification Search .................. 257/295, 257/421
See application file for complete search history.

(56) References Cited

U.S. PATENT DOCUMENTS

| | | | |
|---|---|---|---|
| 2002/0048128 A1* | 4/2002 | Kamiguchi et al. | 360/324.1 |
| 2003/0123200 A1* | 7/2003 | Nagasaka et al. | 360/324.1 |
| 2007/0159733 A1* | 7/2007 | Hashimoto et al. | 360/324.1 |
| 2008/0180991 A1* | 7/2008 | Wang | 365/171 |
| 2011/0039020 A1* | 2/2011 | Ingvarsson et al. | 427/128 |

* cited by examiner

*Primary Examiner* — Zandra Smith
*Assistant Examiner* — Jamie C Niesz
(74) *Attorney, Agent, or Firm* — Maryam Imam; IPxLaw Group LLP

(57) ABSTRACT

A non-uniform switching based non-volatile magnetic memory element includes a fixed layer, a barrier layer formed on top of the fixed layer, a first free layer formed on top of the barrier layer, a non-uniform switching layer (NSL) formed on top of the first free layer, and a second free layer formed on top of the non-uniform switching layer. Switching current is applied, in a direction that is substantially perpendicular to the fixed layer, barrier layer, first free layer, non-uniform switching layer and the second free layer causing switching between states of the first free layer, second free layer and non-uniform switching layer with substantially reduced switching current.

10 Claims, 10 Drawing Sheets

NON-UNIFORM SWITCHING BASED NON-VOLATILE MAGNETIC BASED MEMORY

CROSS REFERENCE TO RELATED APPLICATIONS

This application is a divisional of U.S. patent application Ser. No. 11/674,124, filed on Feb. 12, 2007, and entitled "Non-Uniform Switching Based Non-Volatile Magnetic Based Memory", which claims priority to U.S. Provisional Application No. 60/853,115 entitled "Non-Uniform Switching Based Non-Volatile Magnetic Base Memory", filed on Oct. 20, 2006.

BACKGROUND OF THE INVENTION

1. Field of the Invention

The present invention relates generally to non-volatile magnetic memory and particularly to non-uniform switching of non-volatile magnetic based memory.

2. Description of the Prior Art

Computers conventionally use rotating magnetic media, such as hard disk drives (HDDs), for data storage. Though widely used and commonly accepted, such media suffer from a variety of deficiencies, such as access latency, higher power dissipation, large physical size and inability to withstand any physical shock. Thus, there is a need for a new type of storage device devoid of such drawbacks.

Other dominant storage devices are dynamic random access memory (DRAM) and static RAM (SRAM) which are volatile and very costly but have fast random read/write access time. Solid state storage, such as solid-state-nonvolatile-memory (SSNVM) devices having memory structures made of NOR/NAND-based Flash memory, providing fast access time, increased input/output (IOP) speed, decreased power dissipation and physical size and increased reliability but at a higher cost which tends to be generally multiple times higher than hard disk drives (HDDs).

Although NAND-based flash memory is more costly than HDD's, it has replaced magnetic hard drives in many applications such as digital cameras, MP3-players, cell phones, and hand held multimedia devices due, at least in part, to its characteristic of being able to retain data even when power is disconnected. However, as memory dimension requirements are dictating decreased sizes, scalability is becoming an issue because the designs of NAND-based Flash memory and DRAM memory are becoming difficult to scale with smaller dimensions. For example, NAND-based flash memory has issues related to capacitive coupling, few electrons/bit, poor error-rate performance and reduced reliability due to decreased read-write endurance. Read-write endurance refers to the number of reading, writing and erase cycles before the memory starts to degrade in performance due primarily to the high voltages required in the program, erase cycles.

It is believed that NAND flash, especially multi-bit designs thereof, would be extremely difficult to scale below 45 nanometers. Likewise, DRAM has issues related to scaling of the trench capacitors leading to very complex designs which are becoming increasingly difficult to manufacture, leading to higher cost.

Currently, applications commonly employ combinations of EEPROM/NOR, NAND, HDD, and DRAM as a part of the memory in a system design. Design of different memory technology in a product adds to design complexity, time to market and increased costs. For example, in hand-held multimedia applications incorporating various memory technologies, such as NAND Flash, DRAM and EEPROM/NOR flash memory, complexity of design is increased as are manufacturing costs and time to market. Another disadvantage is the increase in size of a device that incorporates all of these types of memories therein.

There has been an extensive effort in development of alternative technologies such as Ovanic Ram (or phase-change memory), Ferromagnetic Ram (FeRAM), Magnetic Ram (MRAM), Nanochip, and others to replace memories used in current designs such as DRAM, SRAM, EEPROM/NOR flash, NAND flash and HDD in one form or another. Although these various memory/storage technologies have created many challenges, there have been advances made in this field in recent years. MRAM seems to lead the way in terms of its progress in the past few years to replace all types of memories in the system as a universal memory solution.

A prior art field-switching MRAM structure used in conventional MRAMs is depicted in FIG. 1. In FIG. 1, an MRAM cell 10 is shown to include a bit line 12 and a transistor 14 and formed there between is the memory element 32 and a number of metal lines 20, 22, 24, 26 formed for ease of manufacturing. The word line (WL) 16 is shown formed on top of the gate of the transistor 14 and the digit line (DL) is shown formed on the bottom of the memory element 32. The memory element consists of three key layers namely the fixed layer, the barrier tunneling layer and the free-layer. In operation, the digit line (DL) 14 is used to change the magnetic orientation of the free-layer of the memory element and thereby creating "parallel" (low resistance) and "anti-parallel" (high resistance) states which become the "0" and "1".

In FIG. 1, M1s 20 and 28, V1 22, M2 24 and V2 26 are examples of how these layers would be processed in order to connect the memory element (or cell) to the transistor 14. The M1 28, on the transistor 14's "drain" side, is connected to a common ground and is deposited, at substantially the same time, as the M1 20 on the "source" side of the transistor 14. The bit line 12 is typically connected through the memory element 32 to the source 30 of the transistor 14. The word-line (WL) 16 is typically connected to the control gate of the transistor 14 for selecting the specific transistor.

The problem with the MRAM cell 10 of FIG. 1 are two-fold namely, the large cell-size and therefore high cost and high-power. The switching of the memory element 32 is made through the magnetic-field generated from the digit-line 18 which limits how closely the neighboring cells can be and thereby leading to larger cell size and thereby higher cost.

One of the problems with prior art memory structures is that the current and power requirements are too high to make a functional memory device. This also poses a key concern regarding the reliability of such device due to likely dielectric break-down of the tunneling barrier layer and thereby making it non-functional.

FIG. 2 shows relevant layers of the memory elements 32 of prior art (MRAMs), such as the cells 10 (FIG. 1) and memory element 32. In FIG. 2, a free layer 60 is shown on top of which is shown formed a tunnel layer 62 on top of which is shown formed a fixed layer 64. The free layer's 60 magnetic moment can change, whereas, the moment of the fixed layer 64, below a known temperature, remains fixed. The tunneling layer 62 is commonly referred to as the "barrier layer". In some prior art structures, the free layer 60 is made of several free layers. Application of current to the structure of FIG. 2 causes switching between anti-parallel (AP) and parallel (P) states, which, in turn represent two logical states for storing information in memory made from the structure of FIG. 2. The relationship between resistances of the two states depends on the tunneling-magneto-resistance (TMR) is defined as:

$$TMR=(Rh-Rl)/Rl \qquad \text{Eq. (1)}$$

Wherein Rh is resistance at a high state and Rl is resistance at a low state.

Low capacity MRAM memory based on a design relying on magnetic-field to switch the memory elements is another known memory. It has been shown that current can also be used to switch the memory elements. The challenge has been that the switching current is too high to allow the making of a functional device for memory applications due to the memory's high power consumption. Several recent publications, such as those cited below as references 5 and 6[5,6] have shown that the switching current can be reduced by having the memory element pinned by two anti-ferromagnetic (AF)-couple layers resulting in spin oscillations or "pumping" and thereby reducing the switching current.

What is needed is storage memory based on magnetic memory for storage of digital information and having reduced switching current in the magnetic memory thereby decreasing power consumption and reduced cell size thereby reducing costs associated with manufacturing the memory.

SUMMARY OF THE INVENTION

To overcome the limitations in the prior art described above, and to overcome other limitations that will become apparent upon reading and understanding the present specification, the present invention discloses a method and a corresponding structure for a magnetic storage memory device that is based on current-induced-magnetization-switching having reduced switching current in the magnetic memory.

Briefly, an embodiment of the present invention includes a non-uniform switching based non-volatile magnetic memory element including a fixed layer, a barrier layer formed on top of the fixed layer, a first free layer formed on top of the barrier layer, a non-uniform switching layer (NSL) formed on top of the first free layer, and a second free layer formed on top of the non-uniform switching layer, wherein switching current is applied, in a direction that is substantially perpendicular to the fixed, barrier, first free, non-uniform and the second free layers causing switching between states of the first, second free and non-uniform layers with substantially reduced switching current.

These and other objects and advantages of the present invention will no doubt become apparent to those skilled in the art after having read the following detailed description of the preferred embodiments illustrated in the several figures of the drawing.

IN THE DRAWINGS

DETAILED DESCRIPTION OF THE PREFERRED EMBODIMENT

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention.

In an embodiment of the present invention, a current-switching MRAM storage-memory is disclosed. Unlike conventional MRAMs that are based on magnetic-field induced switching where an additional "digit-line" is introduced for applying the magnetic-field for switching, the embodiment of the present invention utilizes the use of perpendicular electric current to switch the "free" layer of the magnetic memory element.

Figure 3:
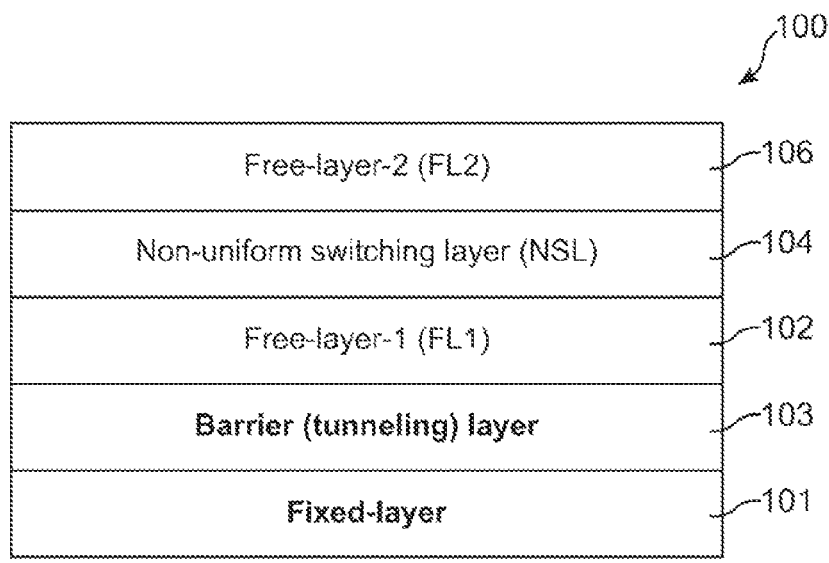
FIG. 3 shows relevant layers of a non-uniform switching based non-volatile magnetic memory element 100 is shown in accordance with an embodiment of the present invention.

Referring now to FIG. 3, relevant layers of a non-uniform switching based non-volatile magnetic memory element 100 are shown, in accordance with an embodiment of the present invention. The memory element 100 is shown to include a fixed layer 101 on top of which is formed a barrier layer 103, on top of which is formed a free layer 1 102 on top of which is formed a non-uniform switching-initiator layer (NSL) 104 on top of which is formed a free layer 2 106, in accordance with an embodiment of the present invention. In one embodiment of the present invention, the layer 101 is made of multiple layers, as will become evident shortly. The layers 102, 104 and 106 of FIG. 3 are all magnetically coupled.

Figure 1:
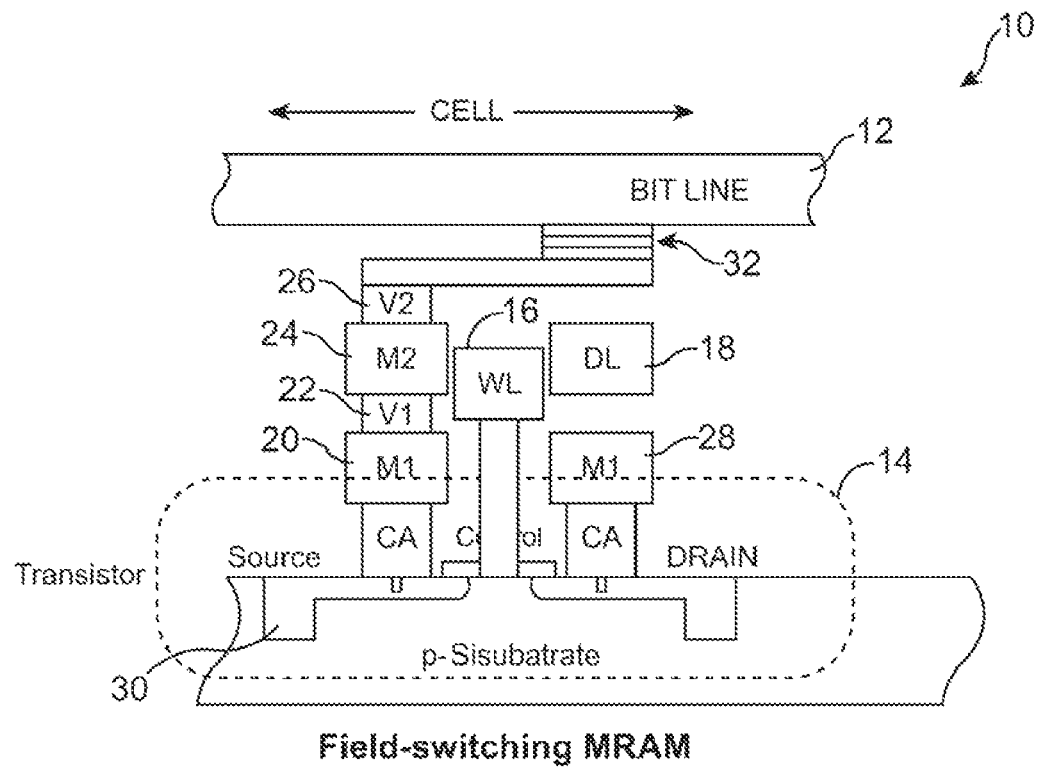
FIG. 1 shows a prior art field-switching MRAM structure used in conventional MRAMs.
Figure 2:
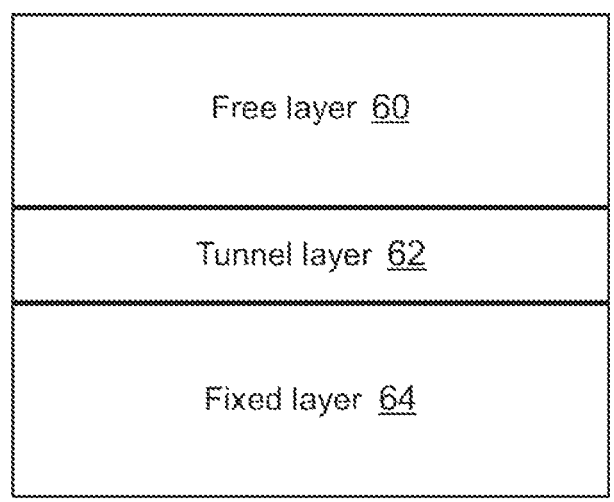
FIG. 2 shows relevant layers of the memory element (or element) of prior art MRAMs.

By way of example, the layers shown in FIG. 3 form a free layer that may be used to replace the free layer 60 of FIG. 2. The memory element 100, among other characteristics, exhibits low switching current when the magnetization switches from one polarity to another. For example, in one embodiment, the memory element 100 has been known to switch with a program current, applied substantially perpendicular to the memory element, within the range of for example, 100 to 1200 µA (micro amps) for memory elements having dimensions of approximately 0.15 µm×0.2 µm.

Thus, in FIG. 3, the memory element 100 is shown to include the fixed layer 101, on top of which is shown formed the barrier layer 103, on top of which is shown the first free layer 102, on top of which is shown formed the non-uniform switching layer 104, on top of which is shown formed the second free layer 106, wherein, in an exemplary embodiment, a switching current is applied, in a direction that is substantially perpendicular to the fixed, barrier, first free, non-uniform and the second free layers, i.e. layers 101, 103, 102, 104 and 106, causing switching between states of the first, second free and non-uniform layers, i.e. layers 102, 106 and 104 with substantially reduced switching current.

It should be noted that the program current scales with the area of the memory element and would go down by $F^2$ where F is the minimum lithographic dimension.

In one embodiment of the present invention, the layer 101 is multi-layered, as previously indicated, the multiple layers of which, in an exemplary embodiment are the following layers: Bottom Electrode (BE) on top of which is formed a seed layer, on top of which is formed an anti-ferromagnetic (AF) pinning layer, on top of which is formed cobolt iron chromium, on top of which is formed Ruthenium X (RuX), where X is one or more of the following: Chromium Cr, Molybdenum (Mo) and Tantalum (Ta), on top of which is formed cobolt iron boron chromium x (CoFeBCrx), wherein, x is typically 0-15 atomic percent.

The barrier (or tunneling) layer 103, as may be referred thereto, is made of magnesium oxide (MgO) and may contain a thin layer of magnesium (Mg) to ensure minimal damage to the underlying CoFeB layer during the time MgO is deposited, and also to ensure more perfect crystalline growth of the MgO layer.

It is worthy to note that the tunneling layer 103 is crystalline but the underlying CoFeB layer may remain mostly amorphous. This results in a smoother interface for enhanced magnetic tunneling. AF pinning layer can be either PtMn or IrMn, and requires magnetic annealing process to create a preferred anisotropy. BE refers to the bottom electrode which is deposited underneath the fixed-layer 100. The free layer, made of layers 102, 104 and 106, is deposited directly on top of the MgO layer and has the structure shown in FIG. 3.

When forming the memory element 100, the layers 102, 104 and 106 are deposited sequentially without breaking the vacuum such that there is direct magnetic coupling between the adjacent layers. The layer 104 is introduced to initiate a non-uniform switching of the free layer during current-induced switching processes leading to a substantially lower switching current being 2 to 5 fold less than that which would have been needed in the absence of the layer 104. The layer 106 is then deposited directly on top of the layer 104 without breaking the vacuum.

In one embodiment of the present invention, a typical thickness of each of the layers 102 and 106 is 1-10 nanometers (nm). The ratio of thickness of the layer 102 to the layer 106 is typically 1-5. The layers 102 and 106 are each typically chosen from alloys having one or more of ferromagnetic primary elements from, for example, the materials Co, Fe and Ni and may include additional non-magnetic elements such as B, Cr, Ru, Mo, Si, Zr, etc. The layer 104 is typically made of an alloy of Co, Fe, Ni having one or more of these elements and including typically less than 50 mol % of oxides, nitrides, sulfides or phosphides such as $TiO_2$, $Al_2O_3$, MgO, $Ta_2O_5$, $HfO_2$, $ZrO_2$, or TaN, and other types of non-conductive material. The choice of these compounds is based on at least two criteria namely, high heat of formation so that it does not decompose during the plasma deposition process using rf- or dc-magnetron sputtering, and low-level of solubility to the base elements such as Co, Fe, Ni and alloys of these. While specific material and sizes are provided herein, they are to serve merely as examples with other suitable material and sizes being contemplated.

In one embodiment of the present invention, in FIG. 3, the layer 102 is made of CoFeBCrx, where x: 0-15 at % and has a thickness within the range of 1-5 nm.

In one embodiment of the present invention, a typical thickness of the layer 104 is 0.5 to 10 nanometers and the ratio of thickness of the layer 102 to that of the layer 102 or 106 is 1:10 with the layer 106 being five times thicker than the layer 102. It should be understood that wherever numbers or values or ranges thereof are provided herein, they are to serve as examples only and other dimensions and sizes are contemplated.

By way of brief background, in magnetic field-based memories, an anti-parallel state is known to have associated therewith, high resistance and a parallel state that is known to have associated therewith low resistance. The anti-parallel and parallel states represent the logical or binary '1' and '0' states that are stored and read to and from memory. In such magnetic-based memory, a pinned (or fixed or AF) layer creates the reference state, and the magnetization of anti-parallel vs. parallel states cause different resistance states.

When the magnetization of the free layer and the fixed layer are parallel the majority of electrons with upwardly spins can easily travel through the barrier tunneling layer, when a voltage is applied, resulting in a low-resistance. When the magnetization of the free layer and fixed layer are anti-parallel, relative to each other, then the majority of electrons with upwardly spins can not tunnel and only the minority electrons with downwardly spins may have a chance to tunnel across the barrier layer under the application of voltage, resulting in a high resistance state.

At a neutral state, which, for example, is typically in the as-deposited state, the AF layer has no moment associated therewith, whereas, when heated beyond a predetermined temperature and under the application of an external magnetic field, the AF layer does have a magnetic moment associated therewith and the state is locked. The AF layer is used to make the fixed-layer. When current is applied perpendicular to the device, the free electrons become spin-polarized after passing through the ferromagnetic-layer. The extent of polarization depends on the type of the ferromagnetic material chosen. These spins following tunneling through the barrier layer apply a spin-torque through the momentum transfer to the moments of the magnetic layer. This spin-torque acts opposite to the intrinsic damping of the magnetic moments of the free-layer. At a sufficient switching-current, such as Is, this can reverse the direction of magnetization of the free layer.

Figure 3A:
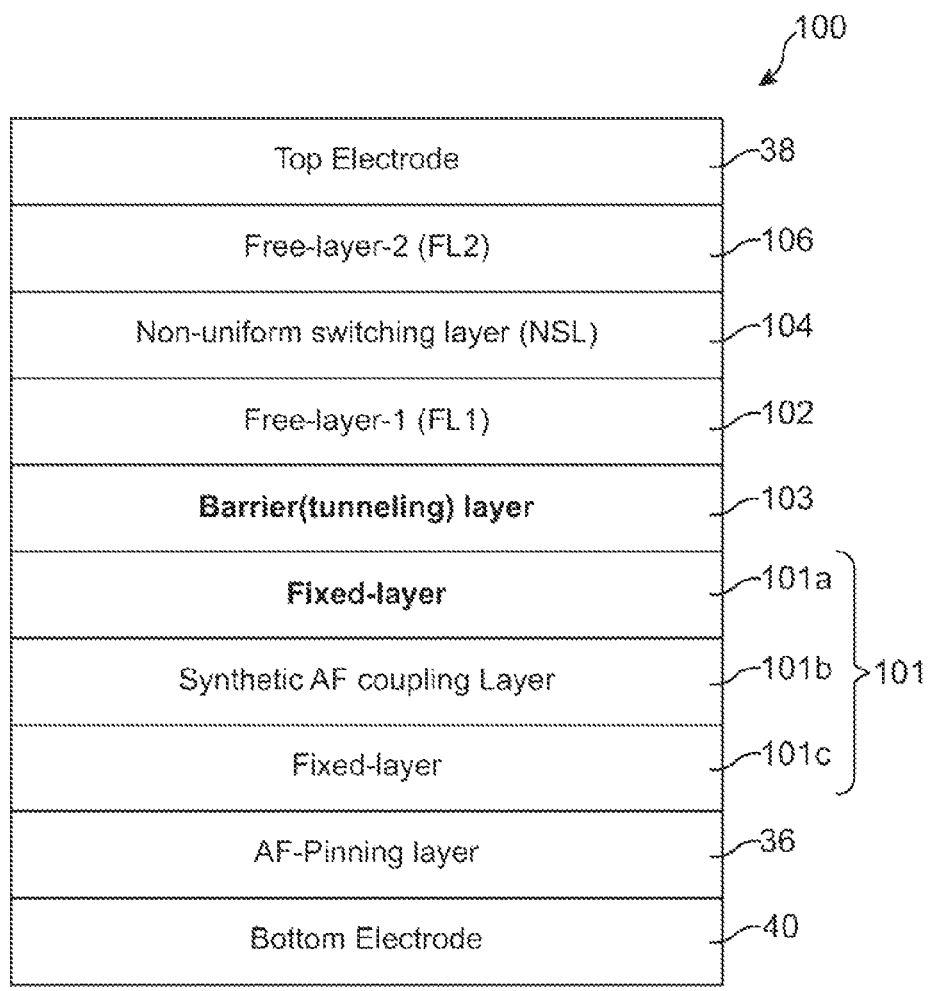
FIG. 3(a) shows additional layers comprising the memory element 100, in accordance with another embodiment of the present invention.

FIG. 3(a) shows additional layers comprising the memory element 100, in accordance with another embodiment of the present invention. For example, in FIG. 3(a), a bottom electrode layer 40 is shown deposited on top of which is shown formed an AF pinning layer 36, on top of which is shown formed the free layer 101. The free layer 101 is shown made of three layers, a fixed layer 101c on top of which is shown formed a synthetic AF coupling layer 101b, on top of which is shown formed a fixed layer 101a on top of which is shown formed the layer 103. The layer 101c is shown formed on top of the layer 36.

Figure 4:
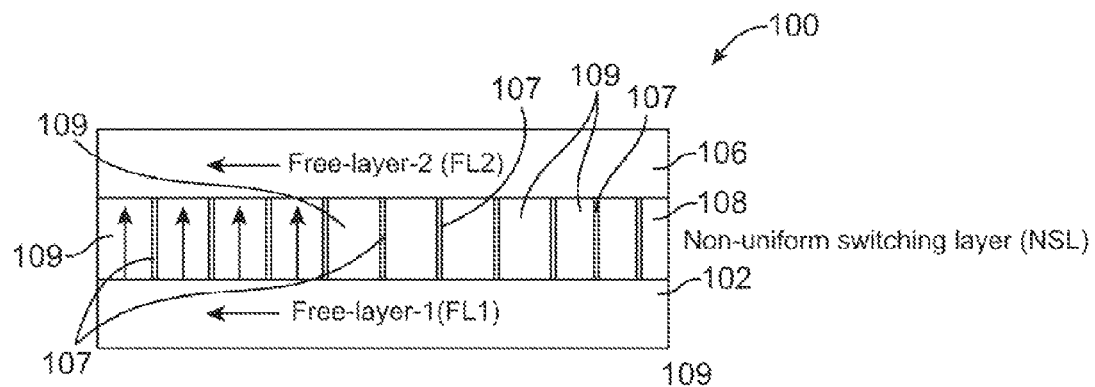
FIG. 4 shows relevant layers of the non-uniform switching based non-volatile magnetic memory element 101 with an alternative structure for the NSL, in accordance with an embodiment of the present invention.

The non-uniform switching-initiator layer, NSL, or layer 104 may have various structures, some of which are shown and described herein. However, it is understood that other structures of the layer 104, not referred to, shown or discussed herein are anticipated. FIG. 4 shows the free layer of the non-uniform switching based non-volatile magnetic memory element 100 with an alternative structure for the NSL, in accordance with an embodiment of the present invention.

In FIG. 4, a non-uniform switching layer (NSL) 108 is shown formed on top of the free layer 102 and on top of the layer 108 is shown formed the free layer 106. The layer 108 results in a low switching-current, Is, due to a resulting non-uniform switching which causes avalanche type switching due to the seeding-effect from the NSL layer. The layer 108 is made of material shown and described relative to a subsequent figure.

In one embodiment of the present invention, the magnetic moment of the layer 108 is substantially perpendicular with respect to the magnetic moments of the free layers 106 and 102 which have in-plane or parallel moments relative to the x-axis. The in-plane structure of the free layers 106 and 102 is the same in other embodiments shown herein although, a perpendicular moment structure is anticipated particularly if the NSL layer exhibits an in-plane moment characteristic.

In one embodiment of the present invention, the layer 106 is made of CoFeX where X is selected from one or more of the following material: B, Zr, Hf, Si, Nb, Ta and W, and is substantially amorphous in the as-deposited state.

The NSL layer 104 may have various structures, some of which are shown and described herein. However, it is understood that other structures of the layer 104, not referred to, shown or discussed are anticipated. FIG. 4 shows relevant layers of the non-uniform switching based non-volatile magnetic memory element 101 with an alternative structure for the NSL, in accordance with an embodiment of the present invention.

In FIG. 4, a non-uniform switching layer (NSL) 108 is shown formed on top of the layer 102 and on top of the layer 108 is shown formed the layer 106. The layer 108 causes low-current switching due to a resulting non-uniform switching.

In one embodiment of the present invention, the magnetic moment of the layer 108 has a magnetic moment that is perpendicular relative to the free layers 106 and 102, which have in-plane or parallel moments relative to the x-axis. The in-plane structure of the free layers 106 and 102 is the same in additional embodiment shown herein although, a perpendicular moment structure is anticipated particularly if the NSL layer exhibits an in-plane moment characteristic.

In FIG. 4, the layer 108 is shown to include micro-channels 107 dispersed between magnetic regions 109 in the layer 108. The micro-channels 107 are made substantially of a non-magnetic material and are separated by a conductive material.

In one embodiment of the present invention, the magnetic regions 109 are each made substantially of material from a group consisting of: CoFe, Ni, Co, Fe and a combination thereof. The non-conductive material are made substantially of material from a group consisting of: $TiO_2$, $Al_2O_3$, MgO, $Ta_2O_5$, $HfO_2$, $ZrO_2$ and TaN.

In operation, during switching of the magnetic states of the memory element 100 of FIG. 3, the following steps occur: Starting switching of magnetic orientations of magnetic regions 109 of the layer 104 or 101; Completing switching of the magnetic orientations of magnetic regions 109; Spreading the affect of the switching of the magnetic orientations of the magnetic regions 109 to one of the free layers 102 and 106; and causing switching of the magnetic orientation of the free layers 102 and 106.

In FIG. 4, the micro-channels 107 are formed during sputtering due to a high affinity of similar molecules and segregation of dissimilar molecules, and are made substantially of the oxide or nitrides. The direction of the arrows shown pointing upwardly in some of the magnetic regions 109, in FIG. 4, represent the perpendicular moment of the layer 108.

In one embodiment of the present invention, the layer 108 is made out of $Co_yFe_{(1-y)}]_{(1-z)}(TiO_2)_z$ where y is 0 to 1 and z is less than 50 mol %, with a preferred range of 4 to 20 mol %. The layer 108 is either directly deposited on top of the layer 102 (of FIG. 3) or alternatively deposited on top of a thin Ru layer (typically 0.2-0.6 nm thick), which is formed on top of the layer 102.

The layer 108 has substantially perpendicular orientation of magnetic moments in the magnetic layer, as shown by the direction of the arrows in the magnetic regions 109, in FIG. 4. This would cause a "torque" to the magnetic spins during switching, resulting in a non-uniform switching and thereby requiring a lower switching current. The thickness of the layer 108, in one embodiment of the present invention, is less than 20 nm. The micro-channels 107 are non-magnetic regions that in an exemplary embodiment may be made of $TiO_2$ while the magnetic regions 109 correspond to the magnetic area of the base magnetic alloy, which in an exemplary embodiment is made of CoFe.

Incorporating $TiO_2$ in the layer 108 results in a microstructure having magnetic grains surrounded by the immiscible $TiO_2$ at the grain-boundaries. $TiO_2$ acts in two ways, namely, causing local channel to enhance the local current density for enhanced switching in combination with the "torque" effect, and also enhancing spin-scattering in the direction normal to the MgO layer (of the fixed layer) leading to enhanced TMR. The preferred choice, as indicated in this case of $TiO_2$ was made based on the criteria of tunneling effects, immiscibility to Co-based alloys and its heat of formation. This layer is deposited using a composite-target which is made by mixing fine powders of constituting elements and compounds in the desired ratios. The film can be deposited using RF or dc-magnetron sputtering. While TiO2 seems to be the preferred choice, other possible choices are $SiO_2$, $Al_2O_3$, MgO, $Ta_2O_5$, $HfO_2$, and $ZrO_2$.

In FIG. 4, the micro-channels 107 are formed during sputtering due to high affinity of similar molecules and segregation of dissimilar molecules, and are made substantially of the oxide or nitrides. The direction of the arrows shown represent the perpendicular moment of the layer. The layer 108 is made out of $Co_yFe_{(1-y)}]_{(1-z)}(TiO_2)_z$ where y is 0 to 1 and z is less than 50 mol %, with a preferred range of 4 to 20 mol % and 107 is made substantially of $TiO_2$. The layer 108 is either directly deposited on top of the layer 102 or alternatively is deposited on top of a thin Ru layer (typically 0.2-0.6 nm thick), which is formed on top of the layer 102.

The layer 104 is expected to have substantially perpendicular orientation of magnetic moments in the magnetic layer, as shown by the direction of the arrows in FIG. 4. This would cause a "torque" to the magnetic spins during switching, resulting in a non-uniform switching and thereby requiring a lower switching current. The typical thickness of the layer 108, in one embodiment of the present invention, is less than 20 nm. It should be noted that in FIG. 4, the areas designated by bold lines at 107 within the layer 108 correspond to a segregated non-magnetic region that in an exemplary embodiment may be made of $TiO_2$ while the lighter open-areas, such as at 109 correspond to the magnetic area of the base magnetic alloy, which in an exemplary embodiment is made substantially of CoFe. It should be noted that the density of segregated "oxide" zone also being referred here as micro-channel 107 and size of 109 can be easily changed by proper selection of the alloy for layer 108 as well as the deposition process. For example, a higher percent of $TiO_2$ would change the thickness of 107 while a higher argon pressure during the time of deposition of layer 109 would make 109 thinner.

Incorporating $TiO_2$ in the layer 108 is to result in a microstructure having magnetic grains surrounded by the immiscible $TiO_2$ at the grain-boundaries. $TiO_2$ acts in two ways, namely, causing local micro-channel to enhance the local current density for enhanced switching in combination with the "torque" effect, and also enhancing spin-scattering in the direction normal to the MgO layer (of the fixed layer) leading to enhanced TMR. The preferred choice, as indicated in this case of $TiO_2$ was made based on the criteria of tunneling effects, immiscibility to Co-based alloys and its heat of formation. This layer is deposited using a composite-target which is made by mixing fine powders of constituting elements and compounds in the desired ratios. The film can be deposited using RF or dc-magnetron sputtering. While $TiO_2$ seems to be the preferred choice, other oxides can be used. Some possible choices are $SiO_2$, $Al_2O_3$, MgO, $Ta_2O_5$, $HfO_2$, TaN and $ZrO_2$.

Figure 5:
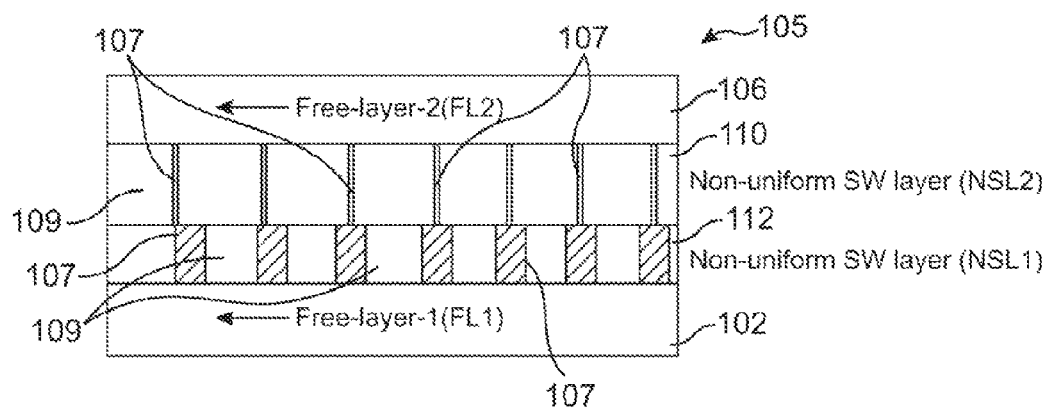
FIG. 5 shows yet another alternative embodiment of a non-uniform switching based non-volatile magnetic memory element 105.

FIG. 5 shows yet another alternative embodiment of the free-layer of a non-uniform switching based non-volatile magnetic memory element 105 wherein on top of the layer 102 is shown formed two non-uniform switching-initiator layers (NSLs) each having different compositions and different amounts of oxides. More specifically, on top of the layer 102 is shown formed a NSL 1 112 on top of which is shown formed a NSL 2 110, on top of which is shown formed the layer 106. While two NSLs are shown between the layers 102 and 106, any number of NSL layers may be formed. Having more than one NSL layer has the effect of causing lower switching current because the spins are tunneled through more efficiently due to a higher concentration of the NSLs.

In the embodiment of FIG. 5, typically higher oxide content is preferably placed closer to the layer 102. This causes a better channeling of spins during the non-uniform switching process leading to a lower switching current. The typical thickness of each of the layers 110 and 112 is less than 20 nm, and their thickness ratio is in the range of 0.1 to 5. It should be pointed out that in FIG. 5, as in FIG. 4, the areas denoted at reference number 107 within the layers 110 and 112 correspond to the segregated non-magnetic $TiO_2$ region while the lighter open-areas, at reference number 109, correspond to the magnetic area of the base magnetic alloy such as CoFe, NiFe, CoNiFe. As in the embodiments of FIGS. 4 and 5, it should be noted that the choice of the non-magnetic compound in the layers 110 and 112, in an exemplary embodiment, is an oxide, nitride, sulphide or phosphide or any combinations thereof. The preferred choice, as indicated in this case of $TiO_2$ is made based on the criteria of tunneling effects, immiscibility to Co- or Fe-based alloys and its heat of formation. This layer is deposited using a composite-target which is made by mixing fine powders of constituting elements and compounds in the desired ratios. The film can be deposited using RF or dc-magnetron sputtering. While TiO2 seems to be the preferred choice, other possible choices are as $SiO_2$, $Al_2O_3$, MgO, $Ta_2O_5$, $HfO_2$, $ZrO_2$, TaN, etc. The free-layers FL1 and FL2 typically have Co—Fe and some additional elements chosen from Ni, Ru, Cr, Mo, Zr, Si. The role of Co is to provide high magneto-crystalline anisotropy while Fe improves the tunneling spin polarization. The typical thickness of layers 102 and 106, in FIG. 5, are each 1-10 nm with their ratios of thickness of the layer 102 to the layer 106 typically being in the range of 1 to 5. The switching current of the memory structure built using FIG. 5 is generally lower than that of the memory structure built using FIG. 4

Figure 6A:
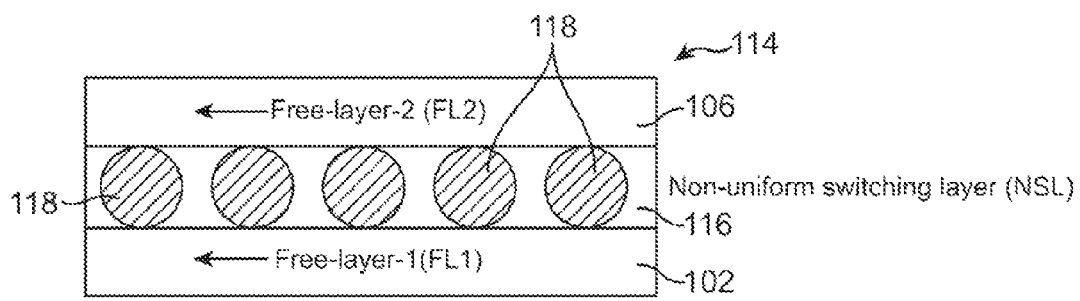
FIG. 6(a) shows yet another embodiment of the relevant layers of a non-uniform switching based non-volatile magnetic memory element 114.

FIG. 6(a) shows yet another embodiment of the relevant layers of a non-uniform switching based non-volatile magnetic memory element 114 wherein on top of the layer 102 is shown formed and then one or more non-uniform based switching layer (NSL) 116 is formed, followed by the layer 106. More specifically, on top of the layer 102 is shown formed the layer 116, on top of which is shown formed the layer 106. In FIG. 6(a), the layer 116 has a granular microstructure, which is shown to include nano-particles 118 made of magnetic and/or non-magnetic parts causing low-current switching due to the non-uniform switching associated therewith. As before, the magnetic layer 102, referred as the free-layer, FL1, and the second magnetic layer 106, referred as free-layer, FL2, may or may not be made of same magnetic alloys. However, one key requirement for the selection of magnetic alloy for FL1 layer is that it should be substantially amorphous in the as-deposited state and then transform to crystalline state following annealing. Additionally, the layer 116 having substantially non-magnetic nano-crystals 118 is likely to be super-paramagnetic if deposited by itself, i.e., be non-magnetic at room-temperature by itself The size of the nano-crystals 118 and their spacing is critical to getting low switching-current. While the preferred processing technique for the non-uniform switching-initiator layer (NSL) 116 may be radio frequency (RF) or direct current (DC) magnetron sputtering, it can also be sputtered by co-sputtering or reactive sputtering process.

Figure 6B:
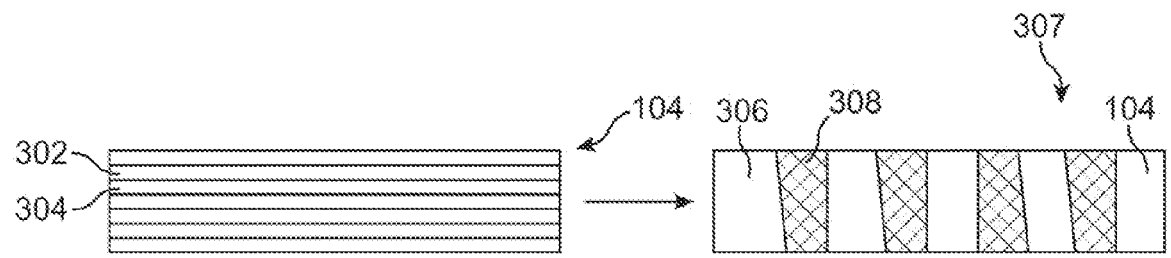
FIG. 6(b) shows the relevant structure for the layer 104, in accordance with still another embodiment of the present invention.

FIG. 6(b) shows the relevant structure for the layer 104, in accordance with still another embodiment of the present invention. Additionally, in FIG. 6(b), there is shown a structure 307, which is made from the layer 104 after the latter has been heated.

The layer 104 is shown to be formed of magnetic layer 302 shown formed on top of the oxide layer 304, which are both formed by alternating and sequentially depositing the layers 302 and 304. The layer 304 is characteristically non-conducting and non-magnetic. In one embodiment of the present invention, the layer 302 is made of $Co_xFe_{(1-x)}$ where 0<x<1, and the layer 304 is made of oxide selected from one or many of silicon dioxide ($SiO_2$), titanium dioxide ($TiO_2$), tantalum penatoxide ($Ta_2O_5$), aluminum oxide ($Al_2O_3$), zirconium oxide ($ZrO_2$), hafnium oxide ($HfO_2$). The layers 302 and 304 are each typically 0.1-5 nm thick, in one embodiment of the present invention.

The process of steps to form the layer 104 will now be discussed. First, the layers 302 and 304 are sequentially deposited and thereafter, a thermal annealing process is performed, which results in a mixture of magnetic region 306, and non-magnetic region 308. In one embodiment the thermal annealing temperature is carried out at 350 C for 20 minutes, following the deposition of the second free-layer 2 (layer 106 in FIG. 3). In yet another embodiment, this annealing process is combined with the final magnetic annealing process. The arrow in the middle of FIG. 6(b) indicates the transformation of the layer 104 into the foregoing regions.

Figure 6C:
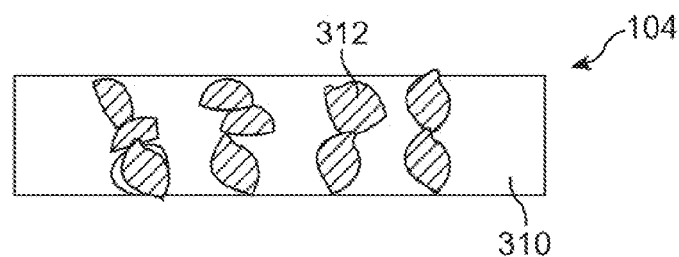
FIG. 6(c) shows yet another embodiment for the non-uniform switching-initiator layer 104, in accordance with another embodiment of the present invention.

FIG. 6(c) shows yet another embodiment for the non-uniform switching-initiator layer 104 which is formed by co-deposition process in which more than one deposition sources are used to result in the microstructure having separated magnetic regions 310 and the non-magnetic regions 312. In one embodiment, two different sputtering targets are used, one comprised of Co—Fe alloy and other of the oxide such at titanium oxide ($TiO_2$). The resulting film has region 310 as the largely magnetic area of Co—Fe and the region 312 is comprised of "oxides" which tend to agglomerate to form large zone, shown as the regions 310 and 312, primarily due to two effects namely, the low solubility in the base magnetic alloys and due to higher affinity of the like-atoms or molecules. The magnetic alloy may be selected from Co—Fe(1-x), where $0<x<1$, and may contain additional elements from chromium (Cr), molybdenum (Mo), copper (Cu), tantalum (Ta) and boron (B). The "oxide" may be selected from from one or many of oxides, silicon dioxide ($SiO_2$), titanium dioxide ($TiO_2$), tantalum penatoxide ($Ta_2O_5$), aluminum oxide ($Al_2O_3$), zirconium oxide ($ZrO_2$), hafnium oxide ($HfO_2$). Additionally, it may also contain nitrides, sulphides and phosphides of these.

Figure 6D:
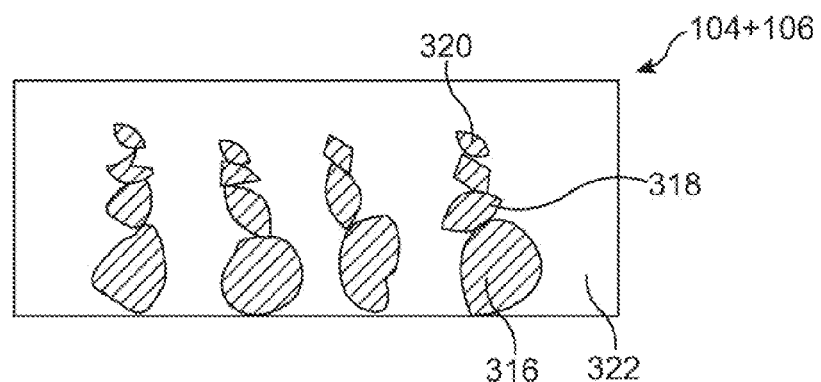
FIG. 6(d) shows yet another embodiment for both the non-uniform switching-initiator layer 104 and the second free-layer 106.

FIG. 6(d) shows yet another embodiment for both the non-uniform switching-initiator layer 104 and the second free-layer 106. In one embodiment, the layers 104 and 106 are deposited by sputtering process such as using DC or RF magnetron sputtering and a largely oxidizing gas is introduced right after the completion of the deposition of the free-layer 102. In one embodiment nitrous oxide ($N_2O$) is introduced pre-mixed with argon gas in the ratio of 0.5 to 40 volume percent. The gas is kept on typically for the time corresponding to the thickness of the non-uniform switching-initiator layer 104. Since the gas is introduced as a spike, i.e. fast rise time, this results in the formation of the non-magnetic/non-conducting zones as shown in the regions 316 and 318. In one embodiment, the base alloy is a magnetic alloy which may be selected from Co—Fe(1-x), where $0<x<1$, and may contain additional elements from titanium (Ti), chromium (Cr), molybdenum (Mo), copper (Cu), tantalum (Ta) and boron (B). When $N_2O$ is introduced it forms oxides of the base alloys. It is very likely that such oxides may not be completely non-magnetic. It is more important that the resulting oxides, nitrides and any mixture of these be non-conducting for the spin-polarized electrons during the program and erase process (described in detail in the subsequent sections). It is also likely that the switching process of the magnetization of the free-layers 102 and 106 may have slightly different mechanism than the films generated per other embodiments. The choice of the reactive gas can be from one or many of: water ($H_2O$), nitric-oxide (NO), Oxygen ($O_2$), sulfur dioxide ($SO_2$), carbon dioxide (CO), carbon dioxide ($CO_2$). It is further important that these gases be premixed either in a starting gas bottle, or in the incoming gas line before entering the vacuum deposition system, with inert gas Ar which is considered a preferred choice due to its the lower cost.

Figure 7:
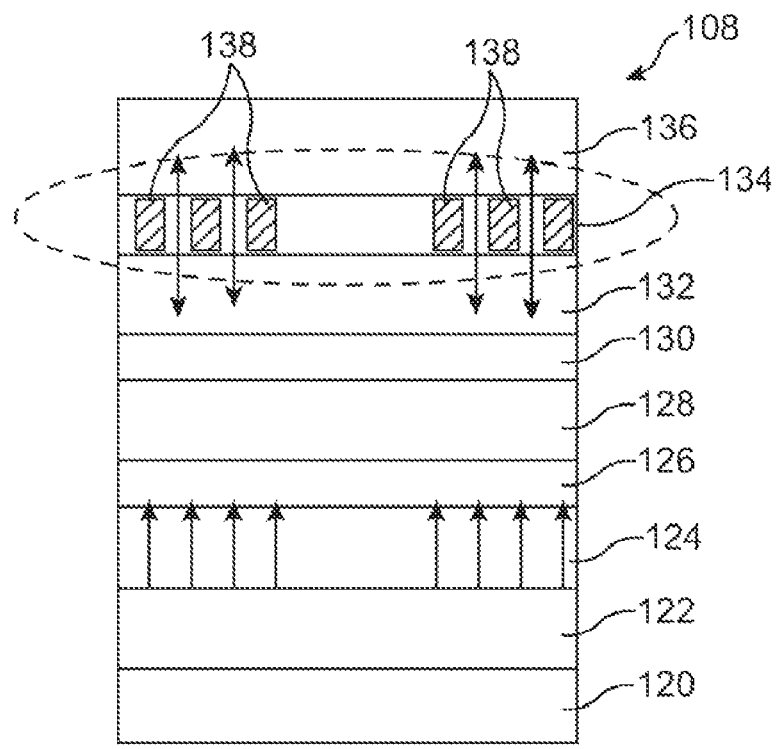
FIG. 7 shows further details of the materials forming the NSL 108 of FIG. 4 or any of the other NSLs of the FIGS. 5 and 6.

FIG. 7 shows another embodiment where the moments in the switching layer are substantially normal to the plane of the film as pointed out by the arrows (pointed upward), unlike the embodiments of FIGS. 4-6 where the net magnetic moment of the free-layer are in-plane (as pointed by the dark arrows). It is believed that such designs would be required for higher capacity designs utilizing smaller design rules, such as below 45 nm. Such designs would typically have circular in-plane shape, as opposed to elongated in-plane shape for the designs having the magnetic moments substantially parallel to the film plane, as for the embodiments of FIGS. 4-6. The key non-uniform switching-initiator layer (NSL) to get low switching current, Is, is 134 which comprises substantially of $Co_{(x)}$—$Fe_{(1-x)}]_{(1-y)}$—$(TiO_2)_y$ where x is the atomic percent of the element in the alloy and y is the molar percent. A preferred range of x is less than fifty percent and y is typically greater than six molar percent. In FIG. 7, the NSL layer 134 of the non-volatile memory element 108 is shown to include the non-magnetic regions 138 which are formed during growth of layer 134 due to phase-segregation. In fact, the selection criteria of the non-magnetic additive are namely, low miscibility in the magnetic alloy, and high heat of formation. In addition, although not required, this compound preferably exhibits spin-tunneling characteristics. Therefore, a desirable material candidate is titanium dioxide ($TiO_2$) or other types of compound having similar oxide characteristic, such as TiOx where x is a value between the integer numbers 1 and 2. Other compounds include but are limited to Silicon dioxide ($SiO_2$), tantalum pentaoxide ($Ta_2O_5$), strontium oxide (SrO), chromium dioxide ($Cr_2O_3$), zirconium dioxide ($ZrO_2$), hafnium dioxide ($HfO_2$), tantalum nitride (TaN), zirconium nitride (ZrN), chromium nitride (CrN).

Figure 8:
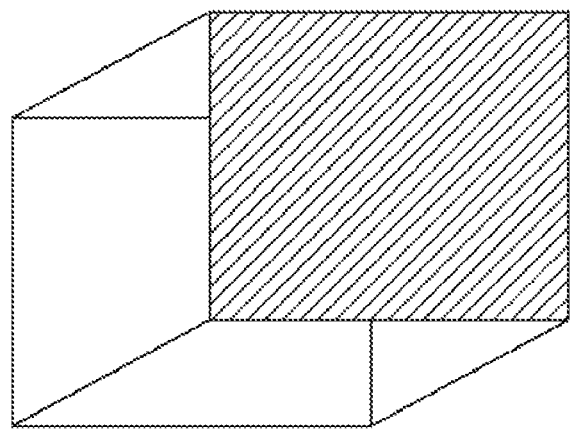
FIG. 8 shows the key crystal plane of Cr under-layer which is made to grow substantially parallel to the film plane in order to ensure perpendicular growth of the magnetic moments of the subsequent fixed layer.

In one embodiment of the present invention, the anti-ferromagnetic (AF) pinning layer 120 has a thickness between 2 to 20 nm and is comprised of alloys such as iridium-manganese (IrMn), platinum-manganese (PtMn), nickel-manganese (NiMn), with these a alloys and including additional elements from Cr, Ta, Ti, Zr and W. The layer 122 is the under-layer for facilitating proper out-of-plane growth of the magnetic moments of the subsequent magnetic layer 124. In another embodiment the magnetic 124 layer is an alloy of Co—Fe—Ni—Pt where the Pt is about fifty atomic percent of the alloy, and the resulting alloy is substantially cubic in crystallography, more specifically having the crystal structure of body-centered-cubic (BCT). The relative ratios of Co, Fe and Ni are selected to ensure that firstly, the resulting alloy is substantially cubic. The magnetic properties such as magnetization, Ms, and the magneto-crystalline anisotropy, K, are also adjusted for the resulting alloy to ensure product reliability, such as from the thermal stability and from the variations, and to also ensure high-levels of polarization of the incoming random-electrons during the read and write(program) operations of the resulting memory or storage-memory products. The layer 124 is grown epitaxially over the under-layer 124 by having a substantial matching of the crystal planes of the two layers to get magnetic moments having substantially normal magnetic moments with respect to the film plane. It is likely that additional seed-layers such as chromium tantalum (CrTa), chromium tungsten (CrW), chromium molybdenum (CrMo), ruthenium aluminum (Ru Al), nickel aluminum (NiAl) can be grown underneath the under-layer 122 to get better crystallographic matching between the alloys of layers 122 and 124. In a yet another embodiment, the under-layers and seed-layers are placed underneath the AF-pinning layer 120. The choice of under-layers may include alloys of Cr—X where X is Ta, W, Mo, and B. One of the key requirements of the seed-layer and the processing conditions are such that the under-layer has substantially (200) crystal plane (as shown in FIG. 8 marked at the shaded-plane) growing parallel to the substrate surface. This results in a better epitaxial matching with the BCT (body-centered-tetragonal) Co—Fe—Ni—Pt layer 124 due to good atomic matching between the two layers.

Typically, 126 is a thin layer of $Co_xFe_{(1-x)}]_{(1-y)}B_y$ (typically less than 2 nm thick), where x is typically between 0.2 to 0.8 and y is between 0.12 to 0.4, as the adjacent-layer to the tunneling barrier layer 128. The layer 128 is the tunneling barrier layer and is preferred to be crystalline MgO. While MgO provides a very high TMR, other materials can be chosen from $Al_2O_3$, $TiO_2$, EuO. It is also likely that an alloy of these compounds could also be used. In case of MgO for layer 128, this layer is generally substantially amorphous and requires a subsequent heat annealing at a temperature over 250° C. for over 30 minutes to get the crystalline structure. In one embodiment, the annealing temperature is 375° C. and the annealing time is two hours.

The layer 128 is a magnetic layer of $Co_xFe_{(1-x)}]_{(1-y)}B_y$, where x is typically between 0.2 to 0.8 and y is between 0.12 to 0.4. The layer 128 is typically thinner than 2 nm. The layer 132 is a magnetic layer of alloy of Co—Fe—Ni—Pt where the Pt is about fifty atomic percent of the alloy, and the resulting alloy is substantially cubic in crystallography. The relative ratios of Co, Fe and Ni are selected to ensure firstly that, the resulting alloy is substantially cubic, more specifically having the crystal structure of body-centered-cubic (BCT). The magnetic properties such as magnetization, Ms, and the magneto-crystalline anisotropy, K, are also adjusted for the resulting alloy to ensure product reliability, such as from the thermal stability and from the variations, and to get the desired write (or program) and erase currents of the resulting memory or storage-memory product. The layer 128 is typically less than 2 nm thick.

The layer 134 is the key non-uniform switching-initiator NSL-layer to get low switching current and thereby having low write (program) and erase currents for the resulting memory or storage-memory product. The layer 136 is a magnetic layer of alloy of Co—Fe—Ni—Pt where the Pt is about fifty atomic percent of the alloy, and the resulting alloy is substantially cubic in crystallography. The relative ratios of Co, Fe and Ni are selected to ensure firstly that, the resulting alloy is substantially cubic, more specifically having the crystal structure of body-centered-cubic (BCT). This layer 134 is topped with a top electrode layer, typically comprised of tungsten having thickness of over 50 nm. In FIG. 7, the memory element 108, the layers 120, 122, 124 and 126 are considered as the "fixed layer" as shown as 101 layer in the schematic diagram of the memory 100 in FIG. 3.

In a yet another embodiment two additional layers—one of Ru and another layer of an alloy of Co—Fe—Ni—Pt where the Pt is about fifty atomic percent of the alloy, and the resulting alloy is substantially cubic in crystallography, are introduced between layers 124. The layers 130,132,134 and 136 are part of the "free-layer", the layer which primarily switches between "up" and "down" orientations with respect to the plane of the film leading to lo- and hi-resistance states and thereby the "0" and "1" states for the resulting non-volatile memory.

In FIGS. 4, 5 and 6 the magnetic memory element (101, 105 and 114) is shaped to be elongated along the easy axis direction with round corners at the edges to ensure "smooth" switching during the rotation process for the designs having in-plane magnetic moment for the embodiments in FIGS. 4-6. For these embodiments, the "round" and "elongated" shapes of the memory elements are made by using masking and etching processes. Additionally, the magnetic layers of the non-volatile memory elements 101, 105 and 114 as shown in the embodiments in FIGS. 4 to 6, respectively, namely the $CoFeBCr_x$ layer 102 and 106 are deposited in presence of a high magnetic-field, typically over 50 Oe and applied parallel to the intended easy-axis direction which is the long-axis direction of the memory element. This results in additional induced magnetic anisotropy along the long axis direction due to the pair-ordering effect.

Figure 9:
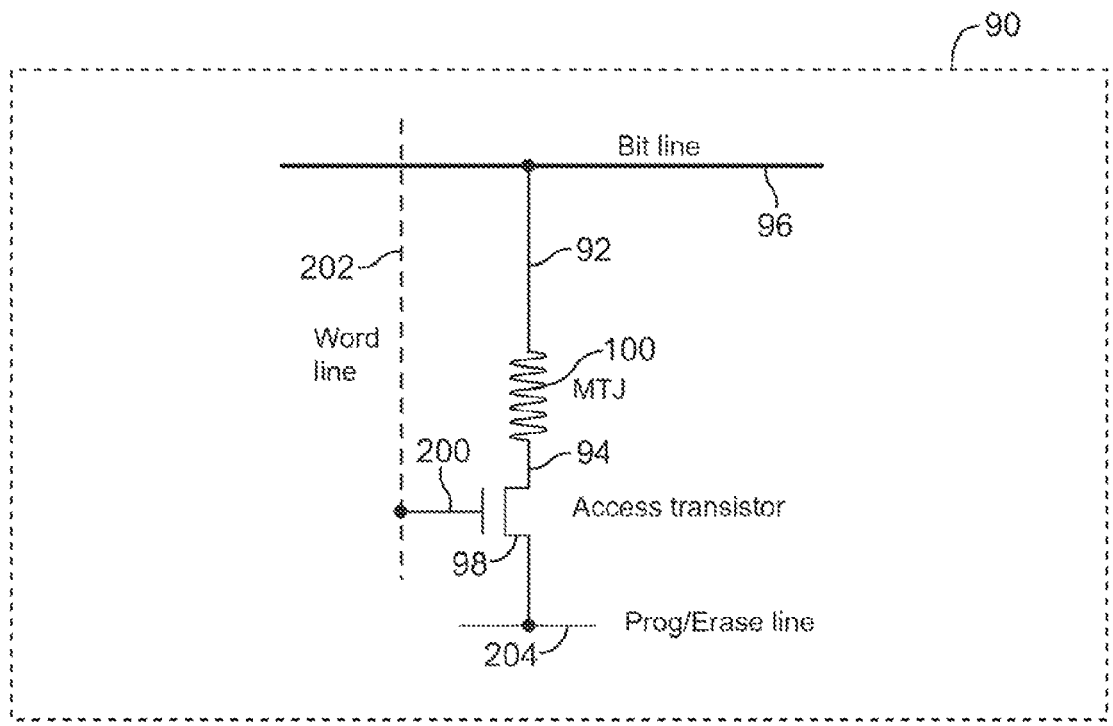
FIG. 9 shows memory architecture of the non-volatile magnetic memory having one transistor and one magnetic memory element

For higher capacity designs, the magnetic anisotropy of the magnetic layer, especially of the free-layer i.e., 102 and 106, is increased by adding Pt to the alloy CoFe ($B_xPt_y$), although the amounts and ratios of Pt and B are varied to ensure that the resulting alloy has the right anisotropy. This is required to overcome the thermal stability issue for smaller memory "bits". For these designs, a higher magnetic-field is required during deposition. The overall goal is to make a highly magnetically oriented in-plane memory. Such highly magnetically oriented memory results in a bigger operational window, resulting in a more reliable design. FIG. 9 shows a magnetic tunnel junction, such as the memory element 100 with an access transistor, in accordance with an embodiment of the present invention. In FIG. 9, the memory element 100 is shown coupled, through an electrode 92, to a bit line 96, on one of its ends. On the other end, the memory element 100 is shown connected to a bottom electrode 94 (BE), through a contact, which is also shown coupled to a drain gate of a transistor 98. The transistor 98 further includes a source shown coupled to the program/erase line 204. The gate 200 of the transistor 94 is shown coupled to a word line 202. The embodiment of the FIG. 9 may be referred to as a single or 1-cell architecture. The MTJ (magnetic tunnel junction also referred to as the memory element 100) acts as the non-volatile memory element. The MTJ element has low resistance in the programmed state and higher resistance in the erased state. For example, in one embodiment of the present invention, the resistance for the low state is at least half of that of the high state. Low and high refer to binary states of '1' and '0' or vice versa. MTJ element or the memory element 100 is shown to have one transistor in series with it for accessing the memory element. The bit line 96 is made of metal and the word line 202 is made of poly-silicon.

In operation, the memory element 100 is accessed in the following manner. The memory (or MTJ) element 100 in conjunction with the access transistor 98 forms the memory element. To program the cell the bit line 96 is connected to some positive power supply while the Prog/Erase line 204 grounded. By accessing this cell the word line 202 is raised to some voltage. This turns the transistor 98 on and current flows from bit line 96 to Prog/erase line 204. Electrons flow in the opposite direction, and go through the fixed layer of the memory element 100 before entering the free layers. This causes the magnetic orientation of the free layers to align with the fix layer and the resistance (R) of the memory element 100 dropped to the minimum. The erase operation on the other hand is performed by changing the direction of the bit line and the program/erase line. This time the Prog/erase line is biased positive while the bit line is grounded. The current will flow from Prog/erase line to bit line, or electrons flow from bit line to Prog/erase line. Since the free and fix layers are magnetically aligned (programmed state), then minority electrons are reflected from the fix layer back into the free layer. These electrons have a spin orientation which is the opposite of the fix layer. When they are injected into the free layer, they apply a moment on the magnetic elements of the free layer in the opposite direction. By pushing enough electrons through eventually the magnetic orientation of the free layers change in the anti-parallel direction, and the MTJ resistance maximizes.

Figure 10:
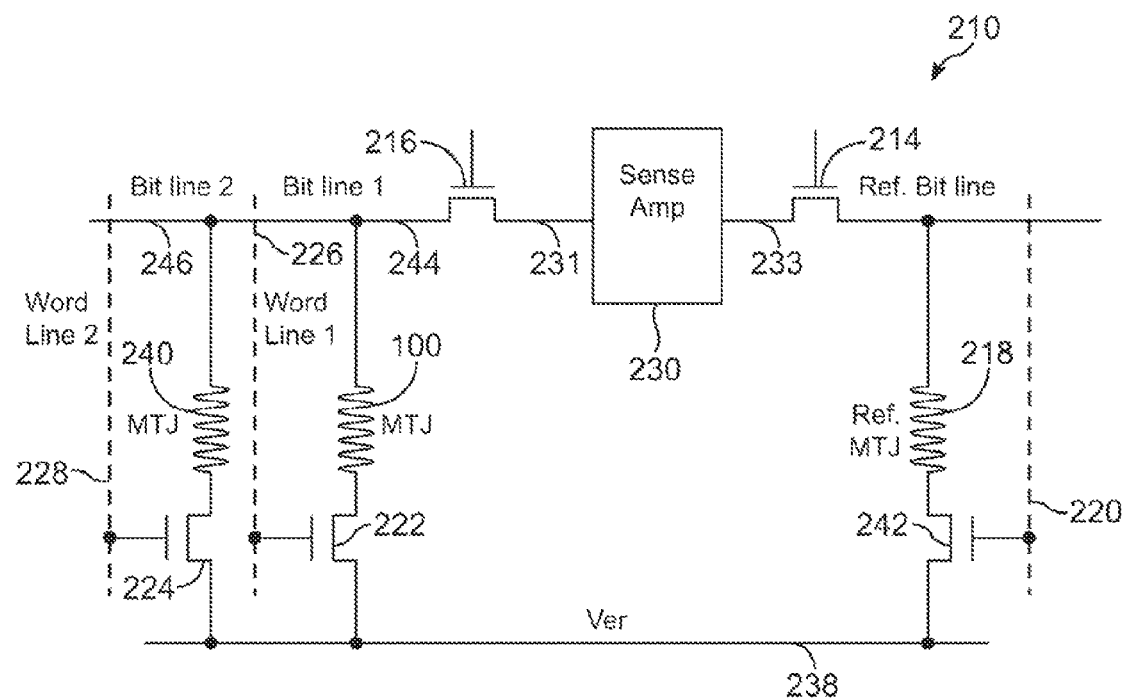
FIG. 10 shows the sensing architecture of the non-volatile magnetic memory.

FIG. 10 shows a sensing circuit 210 including the memory element 100 for sensing or measuring the state of (reading) the memory element 100, in accordance with an embodiment of the present invention. In FIG. 10, the sensing circuit 210 is shown to include a sense amplifier circuit 212 coupled to a first decoding transistor 214 and further coupled to a second decoding transistor 216, at their source. The drain of the transistor 214 is shown coupled to a reference memory element (MTJ) 218 and serves as a reference bit line. MTJs are each made of the memory 100, in one embodiment of the present invention. The reference memory element 218 is further shown coupled to a transistor 242 at the drain of the transistor 242. The gate of the transistor 242 forms a reference word line 220 and the source of the transistor 242 forms the Ver (or erase voltage) 238, which is shown coupled to the source of the transistor 222.

The drain of the transistor 222 is shown coupled to the memory element 100 and an opposite end of the memory element 100 is shown coupled to the drain of the transistor 216 and forms the bit line 1 244. The erase voltage 238 is similarly shown coupled to the source of the transistor 224 and the gate of the transistor 224 is shown to form the word line 2 228. The drain of the transistor 224 is shown coupled to the memory element 240, which on an opposite end thereto, forms the bit line 2 246.

The read operation will now be explained with reference to FIG. 10. During a read operation, the sense amplifier circuit 212 compares the resistance of the memory element 100 of the selected cell to the resistance of the reference memory element 218. The resistance of the cell 218 is designed to be (R1+R2)/2, where R1 is the resistance of the memory element 100 in a low state and R2 is the resistance of the memory element 100 in high state. The high and low states are based on the description provided above where the low state has a characteristic of being at least half of the resistance of that of the high state. The magnetic orientation of the fixed and the free layers are parallel relative to each other at a low state and at a high state, the magnetic orientation of the fixed and free layers are anti-parallel relative to each other.

In one embodiment of the present invention, the sense amplifier 230 is a bi-stable latch or any such device, which flips between states based on the state of the resistance. For example, if resistance is low, the state will be that of a low state and if resistance is high, the state will be that of a high state.

It should be noted that the magnetic memory elements 100 and 240 are two of many magnetic memory elements coupled to bit line 244. The transistors 222 and 224 will select one of these magnetic memory elements based on the selection of one of the word lines 226 or 228. When a word line is selected, it is biased with the appropriate potential required to turn on the selected transistors. When one of the transistors 222 or 224 is selected, the memory element 100 is caused to be coupled to the circuit 230, at 231, through the transistor 216, which as a decoder circuit. At the same time the reference memory element 218 is selected by the transistor 242 and the word line 220. Thereafter, current flows through the selected transistors, i.e. transistor 222 or 224. The current flowing through the reference memory element 218 is always the same, while current flowing through the selected memory elements, such as the memory element 100 depends on the state of that memory element. That is, if the memory element's state is high, its associated resistance (R) is high with respect to the reference memory elements. Thereafter, less current flows through the selected memory elements than the reference memory element 218, causing the sense amplifier circuit 230, at 233, to enter a high state with respect to that of 233. On the other hand, if the selected memory element is at a low state and has low resistance, its current is high with respect to that of the reference memory element 218 and the voltage at 231 drops. In this manner, the voltage at 231 determines the state of the selected memory element.

Figure 11:
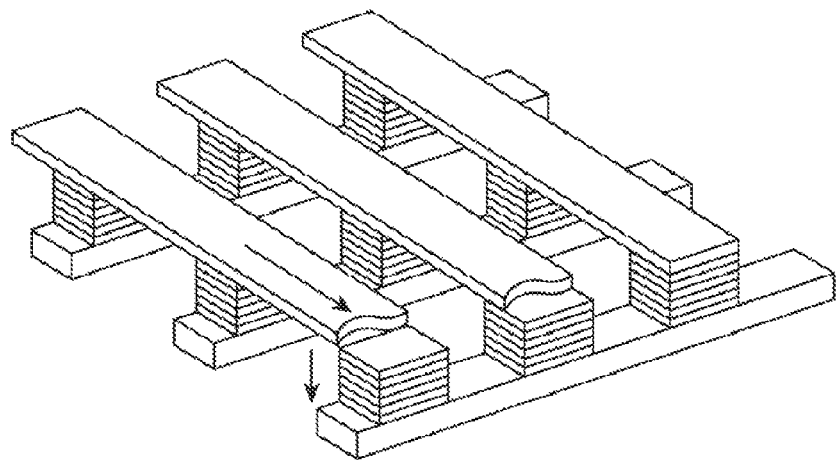
FIG. 11 shows a three dimensional memory structure 400, made of the memory elements of the embodiments of the present invention.

FIG. 11 shows a three dimensional (3-D) view of a memory structure 400 that is made of memory elements of the various embodiments of the present invention, such as the memory element 100. In FIG. 11, current is shown to travel in the path and direction denoted by the arrows. The current direction controls the type of operation.

Figure 12:
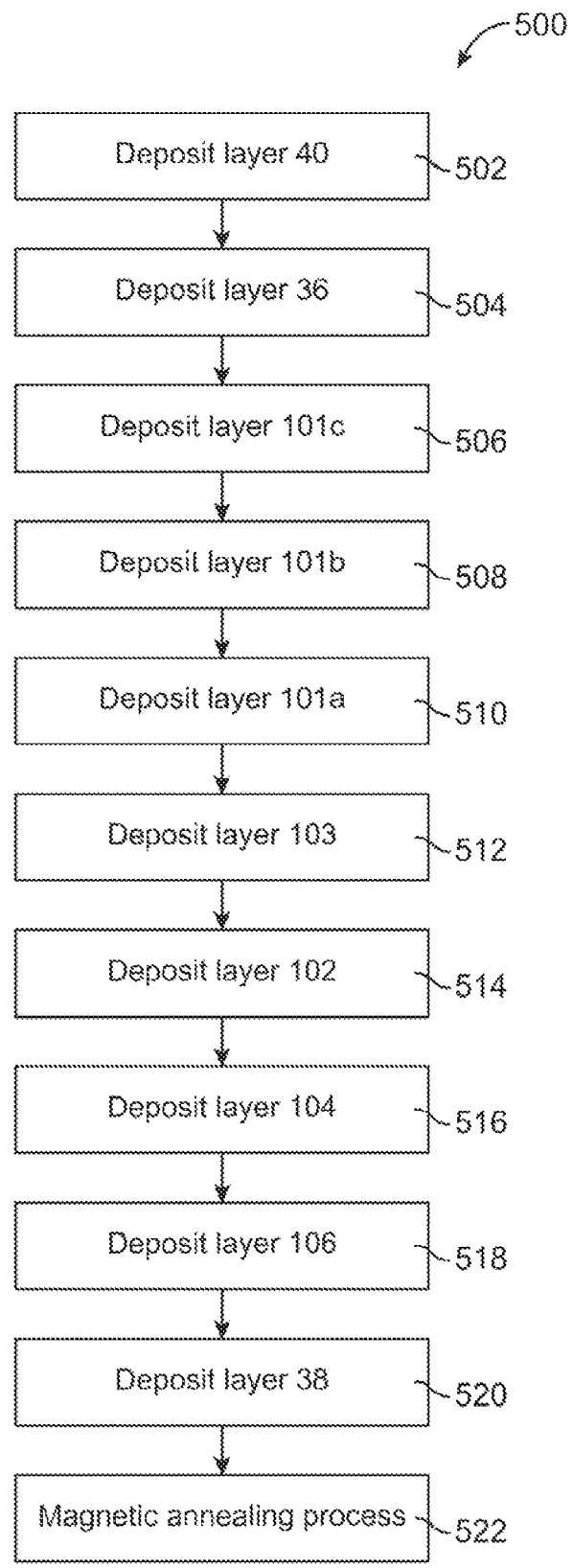
FIG. 12 shows a flow chart of the relevant steps performed in forming the memory element of FIG. 3.

FIG. 12 shows a flow chart of the relevant steps 500 performed in forming the memory element 100 of FIG. 3($a$). In FIG. 12, the layer 40 is deposited at step 502 followed by depositing the layer 36 at step 504. Next, at step 506, the layer 101$c$ is deposited followed by the step 508 wherein the layer 101$b$ is deposited. Next, at step 510, the layer 101$a$ is deposited followed by depositing the layer 103 at step 512. Next, at step 514, the layer 102 is deposited followed by the layer 106 being deposited at step 518. Next, at step 520, the layer 38 is deposited and next, at step 522, magnetic annealing process is performed, as indicated hereinabove.

Figure 13:
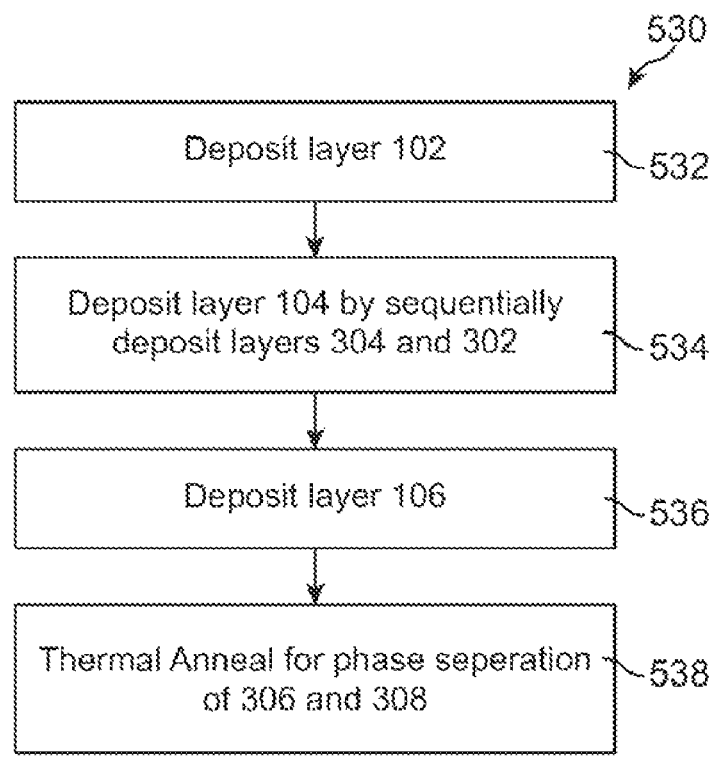
FIG. 13 shows a flow chart of the relevant steps 530 performed in forming the layer 104 of FIG. 6(b), in accordance with one method of the present invention.

FIG. 13 shows a flow chart of the relevant steps 530 performed in forming the layer 104 of FIG. 6($b$), in accordance with one method of the present invention. In FIG. 13, the layer 102 is deposited at step 532, next, at step 534, the layer 104 is deposited on top of the layer 102 by sequentially depositing the layers 304 and 302. Next, at step 536, the layer 106 is deposited on top of the layer 104 followed by the step 538 wherein thermal annealing for phase separation of the layers 306 and 308 are performed.

Figure 14:
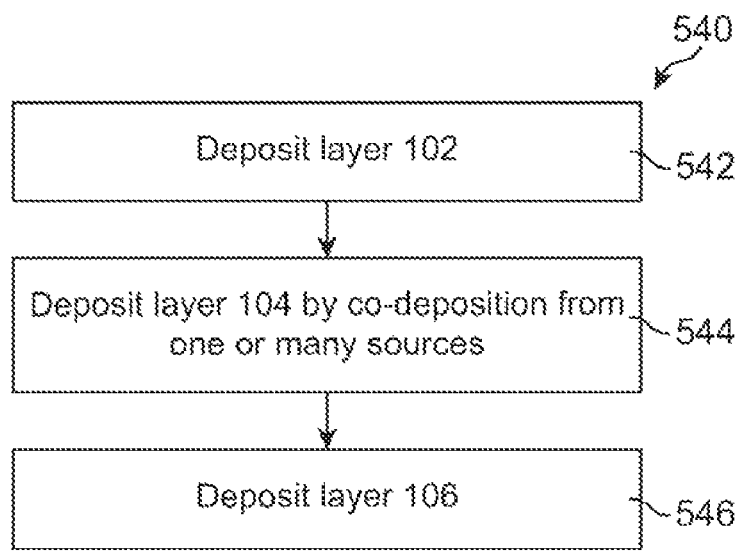
FIG. 14 shows a flow chart of the relevant steps 540 performed in forming the layer 104 of FIG. 6(c), in accordance with another method of the present invention.

FIG. 14 shows a flow chart of the relevant steps 540 performed in forming the layer 104 of FIG. 6($c$), in accordance with another method of the present invention. In FIG. 14, at step 542, the layer 102 is deposited, next, at step 544, the layer 104 is deposited on top of the layer 542 by co-depositing it from one or many sources. Next, at step 546, the layer 106 is deposited on top of the layer 104.

Figure 15:
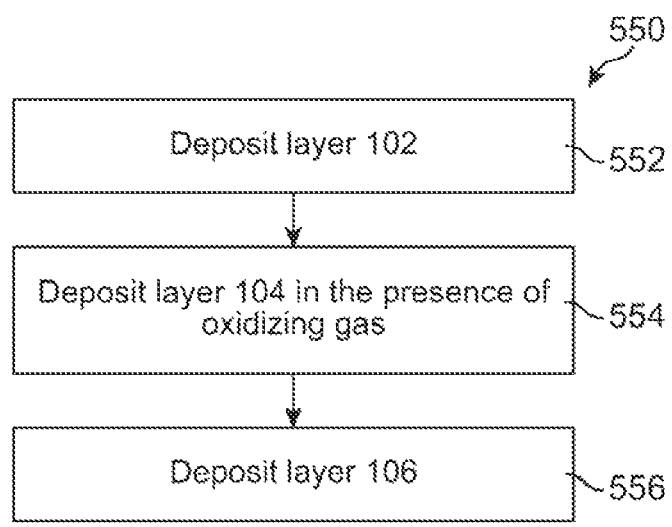
FIG. 15 shows a flow chart of the relevant steps 550 performed in forming the layer 104 of FIG. 6(d), in accordance with another method of the present invention.

FIG. 15 shows a flow chart of the relevant steps 550 performed in forming the layer 104 of FIG. 6($d$), in accordance with another method of the present invention. In FIG. 15, at step 552, the layer 102 is deposited, next, at step 554, the layer 104 is deposited on top of the layer 542 in the presence of oxidizing gas. Next, at step 556, the layer 106 is deposited on top of the layer 104.

Figure 16:
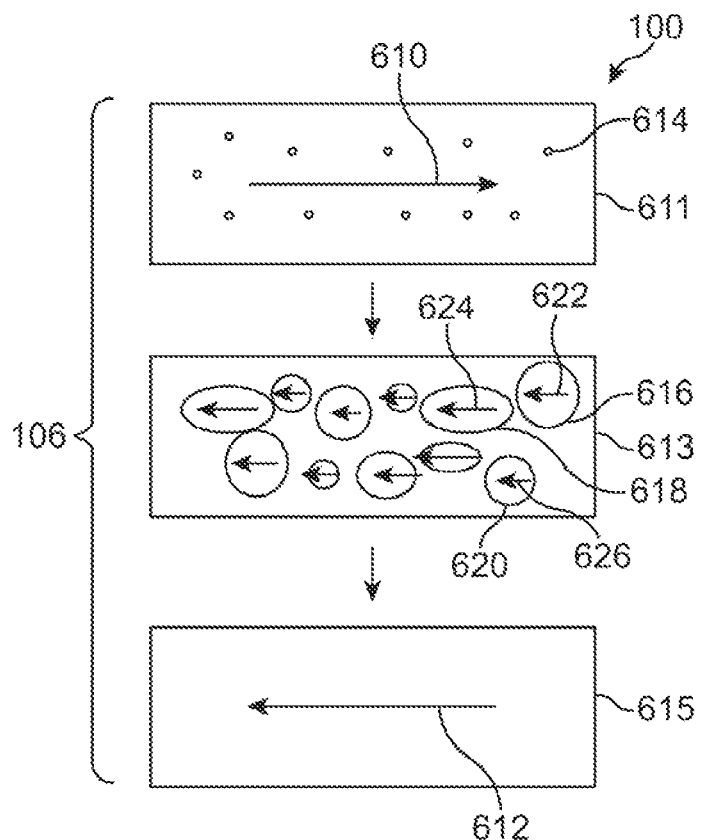
FIG. 16 shows various states of the layer 106 of the memory element 100, during program or erase operations, in accordance with the various embodiments of the present invention.

FIG. 16 shows various states of the layer 106 of the memory element 100, during program or erase operations, in accordance with the various embodiments of the present invention. In FIG. 16, three states are depicted, i.e. 611, 613 and 615, which each show magnetization at various program or erase current being applied. For example, at state 611, no current is applied to the layer 106, therefore, the net magnetization moment is aligned in a direction reflected by the direction of the arrow 610. Further shown in FIG. 16, seeding areas 614 are scattered throughout the layer 106.

At state 613, in FIG. 16, as the program/erase current is applied to the layer 106, the direction of magnetization moment, for each seeding area, switches to a direction opposite to that indicated by the arrow 610. That is, the arrows 622, 624 and 626, as examples, show a local direction of magnetization moment for the seeding areas 616, 618 and 620, respectively. Accordingly, there is shown, in FIG. 16, examples of the reversal switching of the magnetic moments of the seeding layers 616, 618 and 620 wherein their magnetic moments are switch to be in a direction reflected by their respective arrows and which is opposite to the arrow 610.

At state 615, in FIG. 16, as the current being applied is increased, the seeding areas grow out to fuse to each other thereby leading to an avalanche type of switching to cause switching of the direction of the net magnetic moment of the layer 106 to be in opposite to that shown with respect to the state 611. The direction of the net magnetic moment at state 615 is shown to be in a direction indicated by the arrow 612. In one embodiment of the present invention, the current being applied is 30% less than that of prior art current.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of forming a non-uniform switching-initiator layer (NSL) comprising:
    depositing a first free layer, the first free layer being made of CoFeBCr, and having a thickness within the range of 1-5 nano meters;
    sequentially depositing oxide and magnetic layers on top of the first free layer to form a non-uniform switching-initiator layer (NSL), the NSL directly contacting the first free layer and made of magnetic and non-magnetic regions, with the non-magnetic regions making up less than fifty percent of the NSL and the non-magnetic regions making up micro-channels dispersed in the magnetic regions, where the magnetic regions of the NSL are made of CoFe and the non-magnetic regions of the NSL are made of TiO2;
    depositing a second free layer on top of the NSL, the second free layer formed adjacently on top of the NSL directly contacting the NSL, the first free layer, NSL and the second free layer being directly magnetically coupled to each other, the first free layer and the second free layer being made of the same material; and
    forming the magnetic regions and the non-magnetic regions on top of the first free layer by thermally annealing for phase separation of the magnetic regions and the non-magnetic regions.

2. A non-volatile magnetic memory element, as recited in claim 1, wherein the magnetic regions of the NSL are comprised of micro-channels dispersed in the NSL.

3. A non-volatile magnetic memory element, as recited in claim 1, wherein the second free layer has a thickness within the range of 1-10 nanometer.

4. A non-volatile magnetic memory element, as recited in claim 1, wherein the NSL initiates a non-uniform switching of the first free layer and causes reduction of the switching current.

5. A non-volatile magnetic memory element, as recited in claim 1, wherein the first and second free layers each have a thickness and the thickness of the first free layer to that of the second free layer is 5 to 1.

6. A non-volatile magnetic memory element, as recited in claim 1, further including a top electrode formed on top of the second free layer.

7. A non-volatile magnetic memory element, as recited in claim 1, further including a fixed layer on top of which is formed a barrier layer on top of which is formed the first free layer wherein the fixed layer includes a second fixed layer on top of which is formed a synthetic anti-ferromagnetic (AF) coupling layer on top of which is formed a third fixed layer.

8. A non-volatile magnetic memory element, as recited in claim 7, further including a bottom electrode on top of which is formed the fixed layer.

9. A method of making a memory element comprising:
    depositing a bottom electrode layer;
    depositing an anti-ferromagnetic (AF) pinning layer on top of the bottom electrode layer;
    depositing a fixed layer on top of the AF pinning layer;
    depositing a barrier layer on top of the fixed layer;
    depositing a first free layer on top of the barrier layer, the first free layer being made of CoFeBCr, and having a thickness within the range of 1-5 nano meters;
    depositing a non-uniform switching-initiator layer (NSL) on top of the first free layer, the NSL directly contacting the first free layer and made of magnetic and non-magnetic regions, with the non-magnetic regions making up less than fifty percent of the NSL and the non-magnetic regions making up micro-channels dispersed in the magnetic regions, where the magnetic regions of the NSL are made of CoFe and the non-magnetic regions of the NSL are made of TiO2;
    depositing a second free layer on top of the non-uniform switching-initiator layer;
    depositing a top electrode layer on top of the second free layer; and
    performing magnetic annealing.

10. A method of making a memory element, as recited in claim 9, wherein depositing the fixed layer including depositing a first fixed layer on top of the AF pinning layer, depositing a synthetic AF coupling layer on top of the first fixed layer and depositing a second fixed layer on top of the synthetic AF coupling layer.

* * * * *